US011942780B2

(12) United States Patent
Rupp et al.

(10) Patent No.: US 11,942,780 B2
(45) Date of Patent: Mar. 26, 2024

(54) SEMICONDUCTOR SWITCH WITH ESD PROTECTION CIRCUIT

(71) Applicant: Infineon Technologies AG, Neubiberg (DE)

(72) Inventors: Andreas Rupp, Unterhaching (DE); Michael Ammer, Putzbrunn (DE); Gabriel-Dumitru Cretu, Munich (DE)

(73) Assignee: Infineon Technologies AG, Neubiberg (DE)

( * ) Notice: Subject to any disclaimer, the term of this patent is extended or adjusted under 35 U.S.C. 154(b) by 356 days.

(21) Appl. No.: 17/147,352

(22) Filed: Jan. 12, 2021

(65) Prior Publication Data
US 2021/0257833 A1 Aug. 19, 2021

(30) Foreign Application Priority Data

Feb. 13, 2020 (DE) .............................. 102020103706

(51) Int. Cl.
*H02H 9/04* (2006.01)
*H01L 27/02* (2006.01)

(52) U.S. Cl.
CPC ......... *H02H 9/046* (2013.01); *H01L 27/0285* (2013.01)

(58) Field of Classification Search
CPC . H02H 9/046; H01L 27/0285; H01L 27/0266; H01L 27/02; H03K 17/16
USPC .......................................................... 361/54
See application file for complete search history.

(56) References Cited

U.S. PATENT DOCUMENTS

| 2004/0125521 | A1 | 7/2004 | Salling et al. |
| 2005/0275031 | A1 | 12/2005 | Dournelle et al. |
| 2007/0091524 | A1* | 4/2007 | Davis .................. H01L 27/0285 361/56 |
| 2009/0154035 | A1* | 6/2009 | Galvano ................ H02H 9/046 361/56 |
| 2010/0103572 | A1* | 4/2010 | Worley .................... H03F 3/195 361/56 |
| 2012/0154963 | A1* | 6/2012 | Deval .................... H02H 9/046 361/56 |
| 2018/0082992 | A1* | 3/2018 | Mertens ................. H02H 9/046 |
| 2018/0083440 | A1* | 3/2018 | Gao .................... H01L 27/0266 |

OTHER PUBLICATIONS

Office Action, in the German language, from counterpart German Application No. 102020103706.6, dated Jul. 14, 2020, 5 pp.

* cited by examiner

*Primary Examiner* — Thienvu V Tran
*Assistant Examiner* — Sreeya Sreevatsa
(74) *Attorney, Agent, or Firm* — Shumaker & Sieffert, P.A.

(57) ABSTRACT

A clamping circuit for protection against ESD events is described. In accordance with one exemplary embodiment, the circuit comprises the following: a first transistor having a control terminal and a load current path connected between a first contact and a second contact; an amplifier circuit having an amplifier input and an amplifier output connected to the control terminal of the transistor; and a trigger circuit, which is connected between the first contact and the second contact, and comprises a second transistor. The trigger circuit is configured to generate a voltage swing at the amplifier input as a reaction to a discharge current at the first contact by virtue of the fact that at least part of the discharge current drives a control terminal of the second transistor via an intrinsic capacitance of the second transistor.

14 Claims, 5 Drawing Sheets

SEMICONDUCTOR SWITCH WITH ESD PROTECTION CIRCUIT

This Application claims priority to German Application Number 102020103706.6 filed on Feb. 13, 2020, the entire content of which is incorporated herein by reference.

TECHNICAL FIELD

The present description relates to the field of semiconductor switches, in particular to a semiconductor switch having an active clamping circuit for protection against electrostatic discharges (ESD).

BACKGROUND

Active clamping circuits, also called active clamps, are often used, in the case of an electrostatic discharge (ESD event) to activate a low-resistance current path between two pins of a semiconductor chip and to dissipate the electrical charge. This concept is often used particularly in the case of so-called high-voltage (HV) pins. Besides their actual function as a protection circuit in the case of ESD events, clamping circuits are intended to satisfy further requirements, such as e.g. a small chip area requirement and a low clamping voltage. Furthermore, it is desirable for a clamping circuit not to switch on in the case of high DC voltages, but rather only in the case of transient electrostatic discharges. These requirements imply conflicting goals and it is necessary to find compromises. The inventors set themselves the object of improving known clamping circuits.

SUMMARY

The object mentioned above is achieved by means of the circuit according to claim 1 and the circuit according to claim 9. The dependent claims relate to various exemplary embodiments. A clamping circuit for protection against ESD events is described below. In accordance with one exemplary embodiment, the circuit comprises the following: a first transistor having a control terminal and a load current path connected between a first contact and a second contact; an amplifier circuit having an amplifier input and an amplifier output connected to the control terminal of the transistor; and a trigger circuit, which is connected between the first contact and the second contact, and comprises a second transistor. The trigger circuit is configured to generate a voltage swing at the amplifier input as a reaction to a discharge current at the first contact by virtue of the fact that at least part of the discharge current drives a control terminal of the second transistor via an intrinsic capacitance of the second transistor.

In accordance with a further exemplary embodiment, the circuit comprises the following: a. first transistor having a control terminal and a load current path connected between a first contact and a second contact; a first resistor connected between the control terminal of the first transistor and the second contact; a second transistor having a control terminal and a load current path connected between the control terminal of the first transistor and the first contact; a second resistor connected between the control terminal of the second transistor and the first contact; a third transistor having a load current path connected between the control terminal of the second transistor and the second contact; and a third resistor connected between the control terminal of the third transistor and the second contact.

BRIEF DESCRIPTIONS OF TILE DRAWINGS

Exemplary embodiments are explained in greater detail below with reference to drawings. The illustrations are not necessarily true to scale and the exemplary embodiments are not just restricted to the aspects illustrated. Rather, importance is attached to illustrating the principles underlying the exemplary embodiments. With regard to the figures.

DETAILED DESCRIPTION

Figure 1:
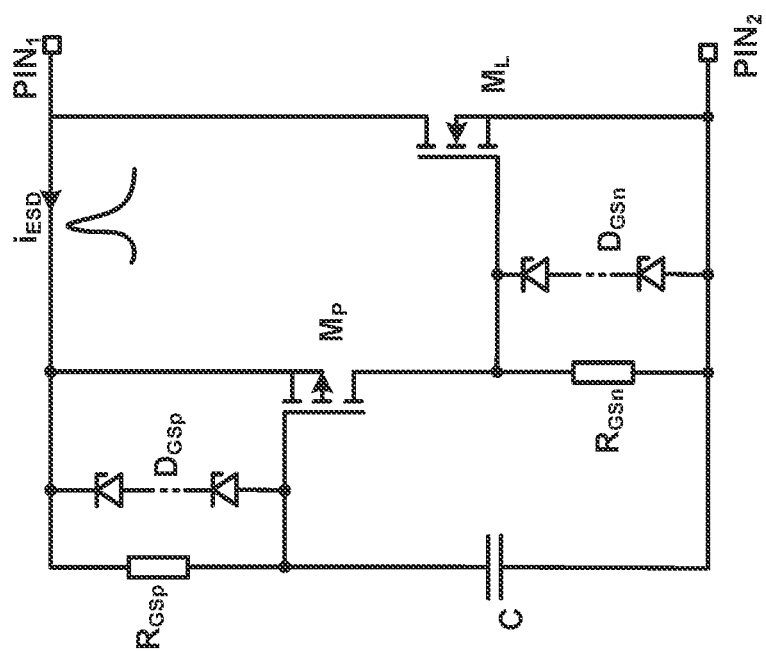
FIG. 1 illustrates one example of a semiconductor switch having a clamping circuit for protection in the case of electrostatic discharges.

FIG. 1 illustrates one example of a semiconductor switch having an active clamping circuit for protection in the case of electrostatic discharges. The semiconductor switch can be a power semiconductor switch and is designated by $M_L$ in FIG. 1. The semiconductor switch $M_L$ is connected between two pins $PIN_1$ and $PIN_2$ of a semiconductor chip and is implemented as a MOS field effect transistor (for example as a DIMS transistor) in the present example. The semiconductor switch is switched on and off depending on a control signal (MOS=metal-oxide semiconductor, DMOS=double-diffused metal-oxide semiconductor) that is fed to the control electrode of the transistor $M_L$. In the case of MOS transistors, the control signal is the gate voltage $V_G$ of the MOS transistor, which voltage is applied to the gate electrode thereof. In order to keep the drawing simple, FIG. 1 contains substantially only the transistor $M_L$ and the active clamping circuit.

In accordance with FIG. 1, the clamping circuit comprises an amplifier circuit, which is substantially constructed by means of a resistor and a further MOS transistor $M_P$ and is operated as a common-source connection. The amplifier circuit comprises an amplifier input and an amplifier output. The latter is connected to the control electrode of the semiconductor switch $M_L$. Specifically, the load current path (drain-source current path) of the MOS transistor $M_P$ is connected between the gate electrode of the semiconductor switch $M_L$ and the first pin $PIN_1$, and a resistor $R_{GSn}$ is connected between the gate electrode of the semiconductor switch ML and the second pin $PIN_2$. The MOS transistor $M_P$ is a p-channel transistor; its drain electrode is connected to the gate electrode of the semiconductor switch $M_L$. The gate electrode of the MOS transistor $M_P$ is the amplifier input, and the drain electrode of the MOS transistor $M_P$ is the amplifier output.

The voltage drop across the resistor $R_{GSn}$ can be regarded as an amplifier output signal, which is fed as gate voltage to the gate electrode of the semiconductor switch $M_L$. To summarize, it can be stated that a signal present at the amplifier input (i.e., in the present example, a gate-source voltage $V_{IN}$ of the MOS transistor $M_P$) is amplified, and the amplified signal is fed as control signal (gate voltage $V_G$) to the control electrode of the semiconductor switch $M_L$.

The input signal (voltage $V_{IN}$) of the amplifier circuit is generated by means of a trigger circuit, which is implemented by means of an RC circuit in the example from FIG. 1. The RC circuit is a series circuit formed by a resistor and a capacitor. In the present case, the resistor $R_{GSp}$ is connected between the first pin $PIN_1$ and the amplifier input (i.e., in the present example, the gate electrode of the MOS transistor $M_P$) and the capacitor C is connected between the amplifier input and the second pin $PIN_2$.

As can be seen in FIG. 1, a current $i_{ESD}$ will occur in the case of an electrostatic discharge between the pins $PIN_1$ and $PIN_2$, which current flows from the first pin $PIN_1$ to the second pin $PIN_2$. It is assumed for the following explanations that the semiconductor switch $M_L$ is initially in a switched-off state. In such a situation, the discharge current $i_{ESD}$ (which may arise on account of an electrostatic discharge at the pin $PIN_1$) will firstly flow through the trigger circuit (that is to say through the RC circuit $R_{GSp}$, C), as a result of which an input voltage $V_{IN}$ (i.e. discharge current $i_{ESD}$ times resistance value of the resistor $R_{GSp}$) arises at the amplifier input, which input voltage is amplified by the transistor $M_P$. The amplified signal (gate voltage $V_G$ and the resulting gate current) thereupon switches on the semiconductor switch $M_L$, which then establishes a low-resistance current path between the pins $PIN_1$ and $PIN_2$ and enables the discharge current $i_{ESD}$ to flow away, without the latter being able to cause damage.

The chains of Zener diodes $D_{GSp}$ and $D_{GSn}$ serve merely for voltage limiting in order to protect the gate electrodes (and in particular the gate oxide) against excessively high voltages. Zener diodes for protecting gate electrodes against overvoltages are known per se and will not be explained in further detail here.

It should be mentioned at this juncture that the RC circuit (trigger circuit) enables the clamping circuit to be dynamically activated. That is to say that the clamping circuit is activated by a rapid rise in the discharge current $i_{ESD}$. The switch-on time of the clamping circuit is substantially determined by the time constant $\tau = R_{GSp} \cdot C$, wherein the capacitor C must be designed to withstand the maximum possible voltage between the pins $PIN_1$ and $PIN_2$ (HV capacitor). In the case of HV pins (i.e. designed for more than 20 V), said capacitor must be implemented by means of metal plates arranged in the metallization layers of the chip. Such a capacitor occupies a considerable chip area. By way of example, the capacitor C may make up 20-30% of the area of the clamping circuit.

A static activation by a DC voltage between the pins $PIN_1$ and $PIN_2$ is not possible (and not actually desired). Such a DC voltage would only result in the capacitor C being charged, without switching on the MOS transistor $M_P$ for an appreciable time (apart from a short time during a rapidly rising edge).

Figure 2:
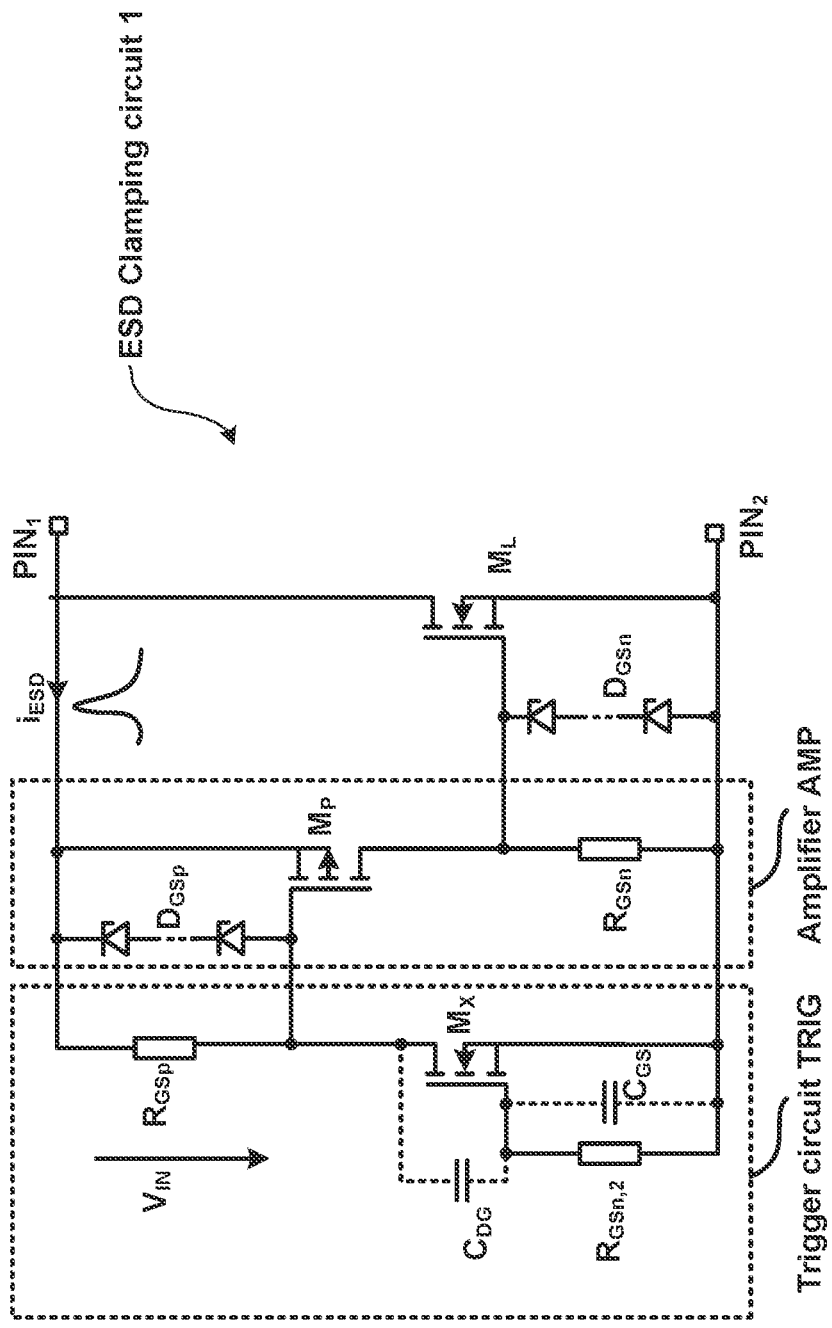
FIG. 2 illustrates a first exemplary embodiment of a semiconductor switch having an improved clamping circuit.

FIG. 2 illustrates, as a first exemplary embodiment, the semiconductor switch having an improved clamping circuit. The circuit from FIG. 2 differs from the circuit from FIG. 1 substantially in the implementation of the trigger circuit, which is designated by TRIG in FIG. 2. The other parts of the circuit (in particular the amplifier circuit AMP, the Zener diode chains $D_{GSn}$, $D_{GSp}$ and the semiconductor switch $M_L$ connected between the pins $PIN_1$ and $PIN_2$) are identical and reference is made to the explanations above. The pins $PIN_1$ and $PIN_2$ can be any chip contacts of a semiconductor chip. The form of the pins depends on the chip package used. Depending on the chip package, the contacts can be configured e.g. as solder pins or solder balls or the like.

In accordance with the exemplary embodiment from FIG. 2, the trigger circuit TRIG of the clamping circuit includes the resistor $R_{GSp}$ connected between the first pin PIN1 and the amplifier input (e.g. gate electrode of the MOS transistor $M_P$). However, the trigger circuit TRIG does not include a capacitor as an independent, dedicated component, in particular does not include an HV capacitor, which as mentioned would occupy a relatively large area. instead, the trigger circuit TRIG comprises a further MOS transistor $M_X$, the load current path of which is connected between the amplifier input and the second pin $PIN_2$, wherein the gate electrode of the MOS transistor $M_X$ is likewise coupled to the second pin $PIN_2$ via a further resistor $R_{GSn,2}$. Like every MOS transistor, the latter has intrinsic capacitances $C_{GS}$ and $C_{DG}$ (gate-source capacitance and gate-drain capacitance), which however are not independent components and, in particular, do not require additional chip area. The intrinsic capacitances and other parasitic capacitances as such would be much too low to perform the function of the capacitor C from the example from FIG. 1. However, as a reaction to an ESD event (discharge current $i_{ESD}$), the transistor $M_X$ can be controlled into a conducting state via the intrinsic capacitances, in particular the drain-gate capacitance $C_{DG}$. If the transistor $M_X$ begins to conduct, a voltage swing (input voltage $V_{IN}$) is generated at the input of the amplifier circuit AMP (i.e. at the gate of the transistor $M_P$), which voltage swing—amplified by the amplifier circuit—switches on the power transistor $M_L$.

As in the previous example, too, it is assumed for the following explanations that the semiconductor switch $M_L$ is initially in a switched-off state. In the case of an ESD event, in such a situation, the discharge current $i_{ESD}$ will firstly flow through the trigger circuit since the MOS transistor $M_P$ initially is not yet conducting. A rapid, transient rise in the discharge current $i_{ESD}$ causes the MOS transistor $M_X$ to be switched on account of the capacitive coupling between drain and gate (gate-drain capacitance $C_{GD}$). As a consequence of this, the current $i_{ESD}$ can flow via the resistor $R_{GSp}$ and the MOS transistor $M_X$, as a result of which a voltage signal $V_{IN}$ arises at the amplifier input. The amplified signal (gate voltage $V_G$ and the resulting gate current) thereupon switches on the semiconductor switch $M_L$, which then establishes a low-resistance current path between the pins $PIN_1$ and $PIN_2$ and enables the discharge current $i_{ESD}$ to flow away, without the latter being able to cause damage. For the purpose of ESD protection, the semiconductor switch $M_L$ can be regarded as a shunt that conducts the discharge current $i_{ESD}$ away via a low-resistance current path.

The trigger circuit TRIG allows a dynamic activation of the clamping circuit, which can be activated by a rapid rise in the discharge current $i_{ESD}$. In the present example, the time constant $\rho$ is $\tau = R_{GSn,2} \cdot C_{GS}$, wherein $C_{GS}$ denotes the gate-source capacitance. The desired time constant can be set by way of a suitable dimensioning of the resistance value of the resistor $R_{GSn,2}$. Static activation of the clamping circuit is not affected.

On account of the possibility of the dynamic activation of the clamping circuit, it is not necessary that a static (predefined) threshold voltage must be exceeded in order to activate the clamp. The trigger circuit reacts to a steep edge of the current $i_{ESD}$ at the pin $PIN_1$. Large capacitors (with regard to area consumption) are not required, for which reason the clamping circuit overall can be realized on a relatively small chip area. The MOS transistor $M_X$ in the trigger circuit TRIG can be of the same transistor type as the semiconductor switch $M_L$. The maximum permitted voltage between the pins $PIN_1$ and $PIN_2$ is thus defined by the breakdown voltage of the transistors $M_X$, $M_L$. and not by other components such as e.g. the capacitor C in the example from FIG. 1. Furthermore, a simple deactivation of the trigger circuit (and thus a deactivation of the clamping circuit) is possible in a comparatively simple manner. One example of this is illustrated in FIG. 3.

Figure 3:
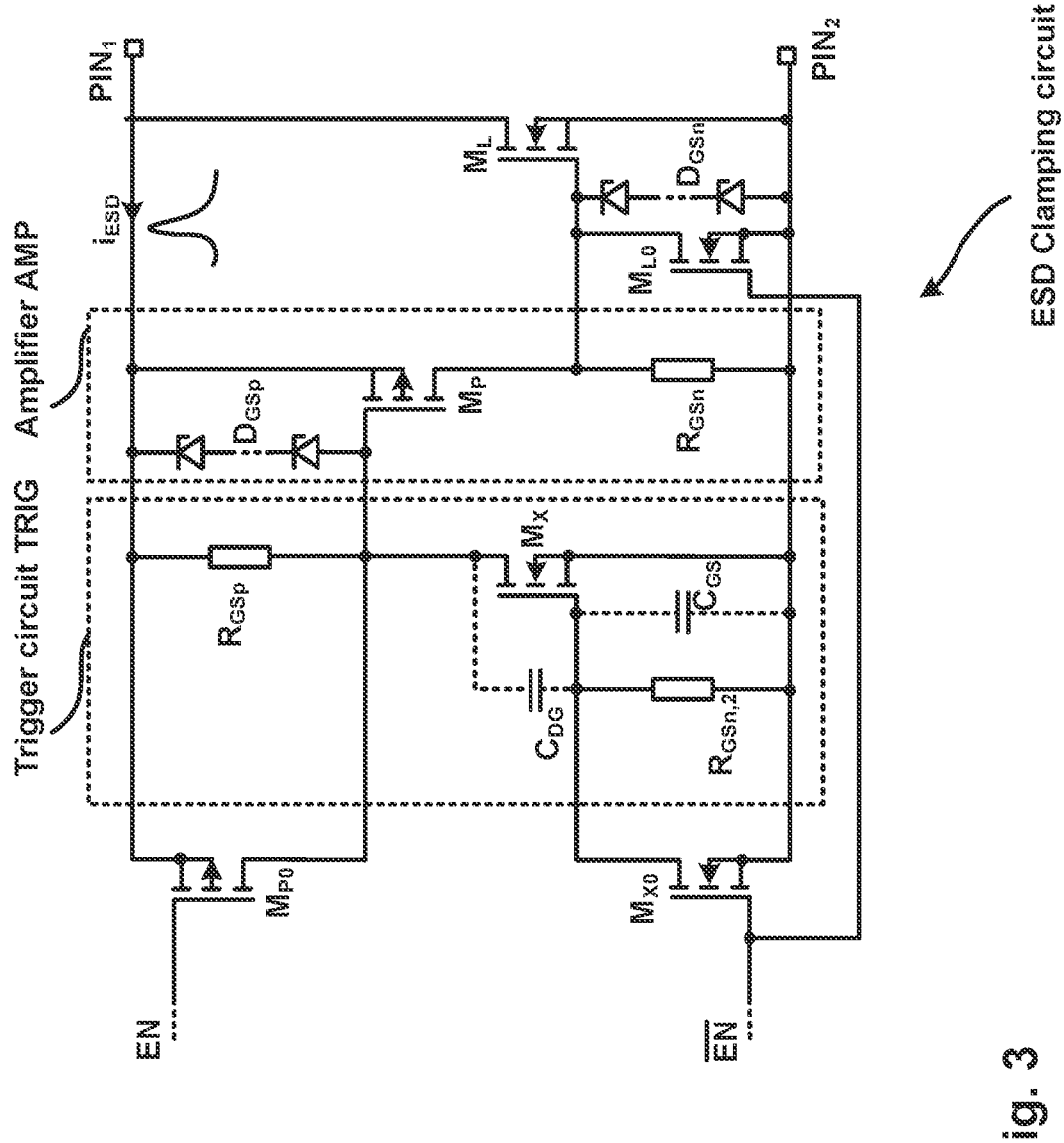
FIG. 3 illustrates a second exemplary embodiment, which is an extension of the example from FIG. 2.

FIG. 3 illustrates a modification/extension of the circuit from FIG. 2. The circuit from FIG. 3 is identical to the circuit from FIG. 2, but includes three additional transistors $M_{P0}$, $M_{X0}$ and $M_{L0}$. Only these additional transistors and their function will be discussed below. For the rest, reference is made to the explanations concerning FIG. 2. The load current path of the transistor $M_{P0}$ connects the gate electrode of the transistor $M_P$ to the source electrode thereof. If the transistor $M_{P0}$ is switched on, gate and source electrodes are short-circuited and the transistor $M_{P0}$ of the amplifier circuit ANT can no longer be driven in a conducting manner. In other words, the transistor $M_{P0}$ is coupled to the amplifier circuit and configured such that it can deactivate the amplifier circuit AMP and prevent an activation of the clamping circuit. The transistor $M_{P0}$ can be a p-channel MOSFET and can receive a logic signal EN as gate signal.

The load current path of the transistor $M_{X0}$ connects the gate electrode of the transistor $M_X$ to the source electrode thereof. If the transistor $M_{X0}$ is switched on, gate and drain electrodes are short-circuited and the transistor $M_X$ of the trigger circuit TRIG can no longer be driven in a conducting manner. In other words, the transistor $M_{X0}$ is coupled to the trigger circuit TRIG and configured such that it can deactivate the bigger circuit TRIG and prevent an activation of the clamping circuit. The transistor $M_{X0}$ can be an n-channel MOSFET and can receive a logic signal $\overline{EN}$ as gate signal, said logic signal being an inverted version of the logical signal EN. In the example shown in FIG. 3, the load current path of the transistor $M_{L0}$ connects the gate electrode of the transistor $M_L$ (semiconductor switch) to the source electrode thereof. The transistor $M_{L0}$ can likewise be switched on by means of the logic signal $\overline{EN}$, as a result of which gate and source of the transistor $M_L$ are short-circuited and the transistor $M_L$ is prevented from switching on. A low level of the logic signal EN (corresponds to a high level of the inverted logic signal $\overline{EN}$) results in a deactivation of the clamping circuit. The deactivation of the clamping circuit by means of the EN or $\overline{EN}$ signal can optionally be carried out by one of the transistors $M_{P0}$, $M_{L0}$ or $M_{X0}$ or by the use of a combination of two or more of these transistors.

It goes without saying that, in the examples described here, MOS transistors can be replaced by other types of transistors. By way of example, bipolar transistors, in particular insulated gate bipolar transistors (IGBTs) can be used instead of MOS transistors. In this case, the terms source and drain refer to the emitter and collector, respectively, of the respective IGBT.

Figure 4:
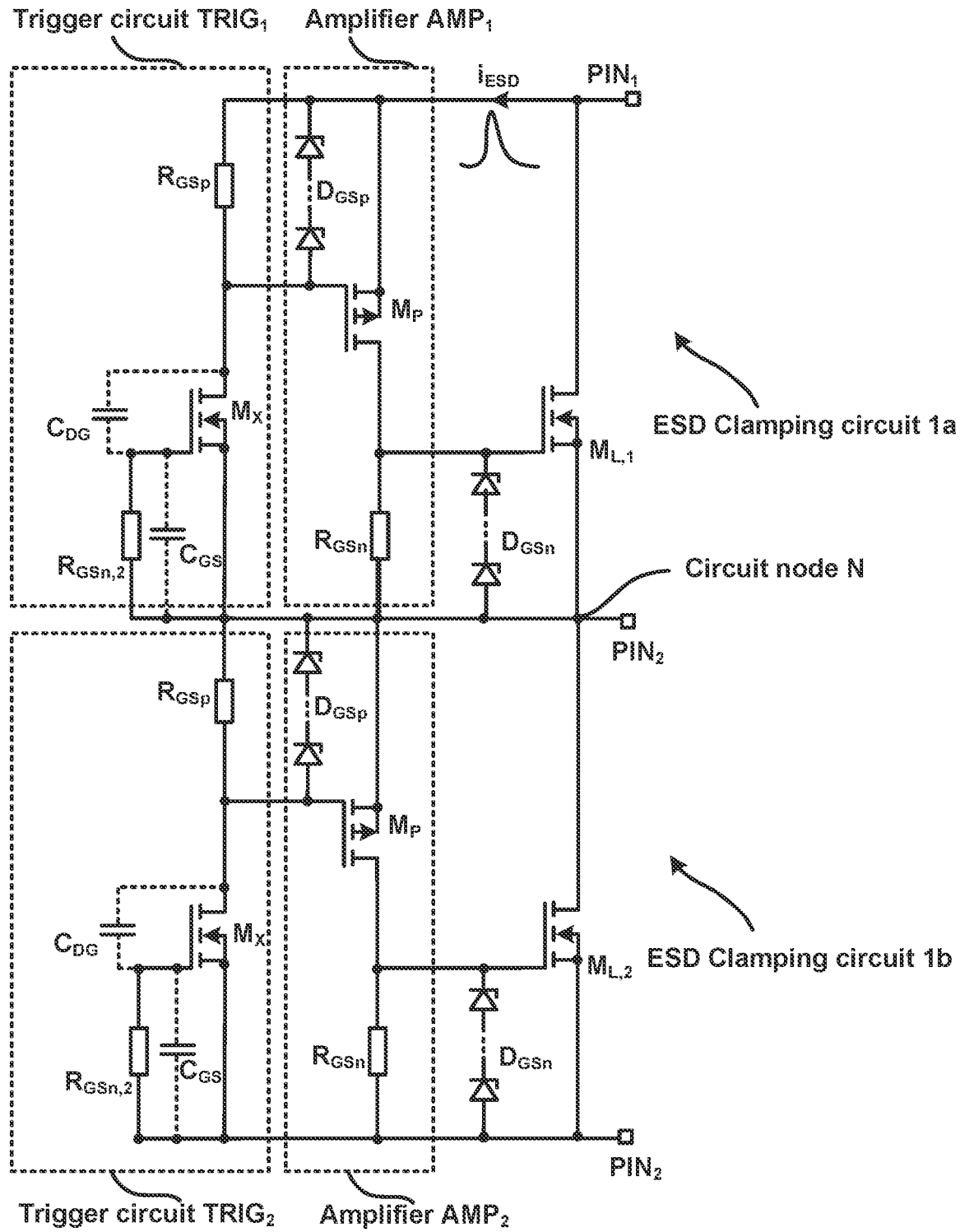
FIG. 4 illustrates a further exemplary embodiment, in which two clamping circuits in accordance with FIG. 2 are connected in series ("stacked").

4 illustrates a further exemplary embodiment, in which two clamping circuits $1a$ and $1b$ are connected in series (stacked configuration), The extensions explained with reference to FIG. 3 can also be used in the example from FIG. 4. The clamping circuit $1a$ comprises the semiconductor switch $M_{L,1}$, which is connected between the first pin $PIN_1$ and the circuit node N, and also an associated amplifier circuit $AMP_1$ and a trigger circuit $TRIG_1$. The clamping circuit $1a$ is identical to the clamping circuit 1 from FIG. 2 with the sole difference that it is not connected between two pins ($PIN_1$ and $PIN_2$), but rather between the first pin $PIN_1$ and an internal circuit node N. The clamping circuit $1b$ comprises the semiconductor switch $M_{L,2}$, which is connected between the circuit node N and the second pin $PIN_2$, and also the associated amplifier circuit $AMP_2$ and the trigger circuit $TRIG_2$. The clamping circuit $1b$ is likewise identical to the clamping circuit 1 from FIG. 2, but—as mentioned—connected between the internal circuit node N and the second pin $PIN_2$. It goes without saying that it is also possible for more than two clamping circuits to be connected in series in order to further increase the dielectric strength of the arrangement.

Figure 5:
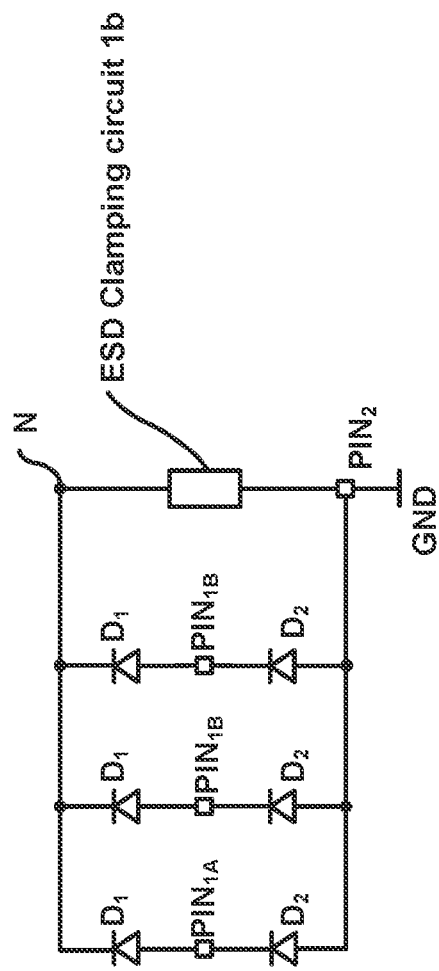
FIG. 5 illustrates a chip having three input/output pins, which are protected by means of a clamping circuit in the case of an ESD event.

In general, the clamping circuit is connected between an input pin (or output pin, e.g. $PIN_1$) and a ground pin (e.g. $PIN_2$) in order to protect the electronics coupled to the input pin against potentially harmful ESD events. The example in FIG. 5 illustrates one example involving a clamping circuit $1b$ for protecting a plurality of pins $PIN_{1A}$, $PIN_{1B}$, $PIN_{1C}$ against ESD events. To that end, the clamping circuit $1b$ is connected between a circuit node N and a chip pin, e.g. a ground pin ($PIN_2$ in FIG. 5). Each of the pins $PIN_{1A}$, $PIN_{1B}$, $PIN_{1C}$ (input/output pins) is coupled to the circuit node N via a diode $D_1$, and the pin $PIN_2$ is coupled to the pins $PIN_{1A}$, $PIN_{1B}$, $PIN_{1C}$ by way of the diodes $D_2$, wherein the cathodes of the diodes $D_1$ and the anodes of the diodes $D_2$ are connected to the clamping circuit $1b$. In the case of an ESD event e.g. at the pin $PIN_{1A}$, a discharge current $i_{ESD}$ can flow away e.g. via the associated diode $D_1$ and the clamping circuit $1b$ toward the pin $PIN_2$ connected to the ground.

The invention claimed is:

1. A circuit comprising:
   a first transistor including a control terminal and a load current path connected between a first contact and a second contact;
   a first amplifier circuit including an amplifier input and an amplifier output, the amplifier output connected to the control terminal of the first transistor;
   a trigger circuit connected between the first contact and the second contact, the trigger circuit comprising:
      a first resistor connected between the amplifier input and the first contact;
      a second transistor including a control terminal, a first node, and a second node,
      the second transistor comprising an intrinsic capacitance coupling the first node of the second transistor to the control terminal of the second transistor, wherein the second node of the second transistor is coupled to the second contact; and
      a second resistor connected between the control node of the second transistor and the second contact,
      wherein the trigger circuit is configured to operate the second transistor in a conducting state in response to a voltage produced across the second resistor as a result of a discharge current from the first contact that flows from the first resistor to the control terminal of the second transistor via the intrinsic capacitance of the second transistor and from the control node to the second contact via the second resistor,
   wherein operating the second transistor in the conducting state generates a voltage swing at the amplifier input; and
   an enable circuit comprising a first enable transistor including a load current path connected between the first contact and the amplifier input, wherein the first enable transistor is configured to deactivate the amplifier circuit based on a logic signal.

2. The circuit according to claim 1, wherein the trigger circuit comprises a second resistor that couples the first contact to the amplifier input of the first amplifier circuit.

3. The circuit according to claim 1, wherein the first contact and the control terminal of the second transistor is electrically connected by a set of intrinsic capacitances, the set of intrinsic capacitances including the intrinsic capacitance of the second transistor.

4. The circuit according to claim 1, wherein the first amplifier circuit comprises a third transistor, which is a MOS transistor and is operated as a common-source connection.

5. The circuit according to claim 1, wherein the enable circuit further comprises:
a second enable transistor including a load current path connected between the control node of the second transistor and the second contact, wherein the second enable transistor is configured to deactivate the second transistor based on the logic signal.

6. The circuit according to claim 1, wherein the first amplifier circuit is configured to operate in response to the voltage swing at the amplifier input of the first amplifier circuit.

7. The circuit according to claim 1, wherein the resistor comprises a resistance value configured to operate the second transistor in response to the discharge current.

8. A circuit comprising:
a first transistor including a first control terminal and a first load current path connected between a first contact and a second contact;
a first resistor connected between the first control terminal of the first transistor and the second contact;
a second transistor including a second control terminal and a second load current path connected between the first control terminal of the first transistor and the first contact,
a second resistor connected between the second control terminal of the second transistor and the first contact;
a third transistor including a third control terminal and a third load current path connected between the second control terminal of the second transistor and the second contact; and
a third resistor connected between the third control terminal of the third transistor and the second contact;
wherein the third transistor comprising an intrinsic capacitance coupling the third control terminal of the third transistor to the second control terminal of the second transistor;
wherein the third transistor is configured to operate in a conducting state in response to a voltage produced across the third resistor as a result of a discharge current from the first contact that flows from the second resistor to the third control terminal of the third transistor via the intrinsic capacitance of the third transistor and from the third control terminal of the third transistor to the second contact via the third resistor,
wherein operating the third transistor in the conducting state generates a voltage swing at the second control terminal of the second transistor;
a fourth transistor including a fourth control terminal and a fourth load current path connected between the first contact and the second control terminal of the second transistor, and
wherein the control terminal of the fourth transistor is configured to receive a logic signal.

9. The circuit according to claim 8,
wherein the third transistor is a MOS transistor,
wherein the intrinsic capacitance comprises a drain-gate capacitance acting between the second control terminal of the second transistor and the third control terminal of the third transistor, and
wherein the third transistor comprises a gate-source capacitance acting between the third control terminal of the third transistor and the second contact.

10. The circuit according to claim 8, wherein a source of the second transistor is connected to the first contact and a drain of the second transistor is connected to the first resistor.

11. The circuit according to claim 8, wherein a time constant of the circuit is set by the intrinsic capacitance of the third transistor and a resistance of the third resistor.

12. The circuit according to claim 11, wherein the time constant of the circuit is further set by a gate-source capacitance of the third transistor acting between the third control terminal of the third transistor and the second contact.

13. The circuit according to claim 8,
wherein the second transistor is a MOS transistor, and
wherein the second control terminal of the second transistor is connected to a source terminal of the second transistor via the second resistor.

14. The circuit according to claim 8, further comprising:
a fifth transistor including a fifth control terminal and a fifth load current path connected between the control terminal of the third transistor and the second contact,
wherein the control terminal of the fifth transistor is configured to receive an inverted logic signal.

* * * * *